United States Patent
Luo et al.

(10) Patent No.: US 9,166,569 B2
(45) Date of Patent: Oct. 20, 2015

(54) RELAXATION OSCILLATOR

(71) Applicant: Generalplus Technology Inc., Hsinchu City (TW)

(72) Inventors: Shih-Ming Luo, Taichung (TW); Min Lu, Shanghai (CN)

(73) Assignee: GENERALPLUS TECHNOLOGY INC., Hsinchu (TW)

( * ) Notice: Subject to any disclaimer, the term of this patent is extended or adjusted under 35 U.S.C. 154(b) by 0 days.

(21) Appl. No.: 14/166,637

(22) Filed: Jan. 28, 2014

(65) Prior Publication Data
US 2014/0368284 A1 Dec. 18, 2014

(30) Foreign Application Priority Data
Jun. 14, 2013 (TW) .............................. 102121191 A (51) Int. Cl.
*H03K 3/0231* (2006.01)
*H03K 4/501* (2006.01)
*H03K 3/03* (2006.01)

(52) U.S. Cl.
CPC ................ *H03K 3/0231* (2013.01); *H03K 3/03* (2013.01); *H03K 4/501* (2013.01)

(58) Field of Classification Search
CPC ................ H03K 3/0231; H03K 3/354; H03K 4/50–4/502
USPC .................................................... 331/111, 143
See application file for complete search history.

(56) References Cited

U.S. PATENT DOCUMENTS

| | | | | |
|---|---|---|---|---|
| 4,983,931 A | * | 1/1991 | Nakano ......................... | 331/111 |
| 6,362,697 B1 | * | 3/2002 | Pulvirenti ..................... | 331/111 |
| 6,600,379 B2 | * | 7/2003 | Anderson ................. | 331/113 R |
| 2005/0007201 A1 | * | 1/2005 | Lee et al. ........................ | 331/16 |
| 2014/0184345 A1 | * | 7/2014 | Lin ............................ | 331/108 C |

\* cited by examiner

*Primary Examiner* — Ryan Johnson
(74) *Attorney, Agent, or Firm* — Muncy, Geissler, Olds & Lowe, P.C.

(57) ABSTRACT

A relaxation oscillator is provided in the present invention. The relaxation oscillator includes a R-S latch, a first delay circuit and a second delay circuit. The input terminal of the first delay circuit is coupled to the Q output terminal of the R-S latch, and the output terminal of the first delay circuit is coupled to the reset terminal of the R-S latch. The input terminal of the second delay circuit is coupled to the inversion Q output terminal of the R-S latch, and the output terminal of the second delay circuit is coupled to the set terminal of the R-S latch. When the input terminal of the first delay circuit inputs a first logic voltage, after a delay time, the output terminal of the first delay circuit outputs a second logic pulse. When the input terminal of the second delay circuit inputs the first logic voltage, after the delay time, the output terminal of the second delay circuit outputs the second logic pulse.

4 Claims, 10 Drawing Sheets

RELAXATION OSCILLATOR

This application claims priority of No. 102121191 filed in Taiwan R.O.C. on Jun. 14, 2013 under 35 USC 119, the entire content of which is hereby incorporated by reference.

BACKGROUND OF THE INVENTION

1. Field of the Invention

The invention relates to a technology of oscillator, and more particularly to a relaxation oscillator which reduces the logic delay.

2. Related Art

With the progress of the technology, the electronic technology has been progressed from the earliest vacuum tube and transistor to the integrated circuit chip, which has the quite wide applications. Thus, the electronic products have gradually become the indispensable essentials in the life of the modern human beings. However, the oscillator is an indispensable important element in analog circuit or digital circuit. The relaxation oscillator is an important oscillator in the oscillators. The relaxation oscillator is commonly used in capacitor sensor and single-chip power integrated circuit. Comparing with the LC oscillator, the relaxation oscillator merely requires one kind of energy storage device. The advantages of the relaxation oscillator includes a wide frequency adjustment range, and a high degree of linear control. A well-designed relaxation oscillator should have high stability, wide adjustable frequency range and high linearity.

Figure 1:
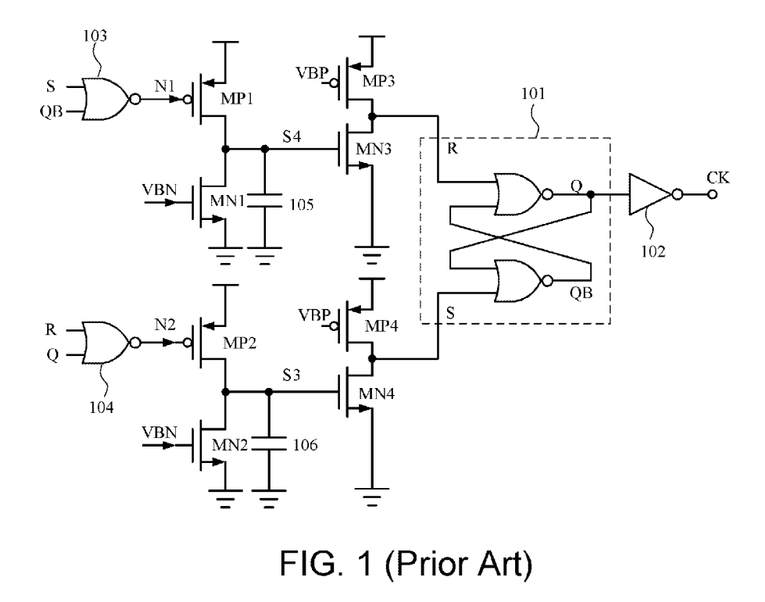
FIG. 1 illustrates a circuit diagram depicting the relaxation oscillator in the conventional art.

FIG. 1 illustrates a circuit diagram depicting the relaxation oscillator in the conventional art. Referring to FIG. 1, the relaxation oscillator includes a R-S flip-flop 101 by two NOR gates, a inverter 102, a NOR gate 103, a NOR gate 104, a first P-type MOSFET MP1, a second P-type MOSFET MP2, a third P-type MOSFET MP3, a fourth P-type MOSFET MP4, a first N-type MOSFET MN1, a second N-type MOSFET MN2, a third N-type MOSFET MN3, a fourth N-type MOSFET MN4, a first capacitor 105 and a second capacitor 106. The first N-type MOSFET MN1, the second N-type MOSFET MN2, the third P-type MOSFET MP3 and the fourth P-type MOSFET MP4 are used for bias (current source). In FIG. 1, the labels VBP and VBN are respectively represent the gate voltage bias of the P-type MOSFET and the gate voltage bias of the N-type MOSFET. In order to conveniently describe it, the node labels N1, N2, S3 and S4 are illustrated.

In order to describe the concept of the oscillator, it is assumed that initial logic states of the reset terminal R, the set terminal S, the Q terminal and Q bar terminal of R-S flip-flop 101 are respectively "0", "1", "1", "0". At this time, the voltage of the node S4 is logic high voltage, the voltage of the node S3 is lower than the threshold voltage of the fourth N-type MOSFET. Because the logic state of the reset terminal R is "0", and the logic state of the Q terminal is "1", the voltage of the output terminal of the NOR gate 104 is logic low voltage so that the P-type MOSFET MP2 is turned on. The capacitor 106 is rapidly charged to the logic high voltage such that the voltage of the set terminal S of the R-S flip-flop 101 becomes logic low voltage. Meanwhile, the logic states of the reset terminal R, the set terminal S, Q terminal and the Q' terminal of the R-S flip-flop 101 are respectively changed to "0", "0", "1" "0".

Afterward, since the logic states of the set terminal S and the Q' terminal are "0", the output terminal of the NOR gate 103 outputs logic high voltage such that the P-type MOSFET MP1 is cut off. The capacitor 105 discharges through the N-type MOSFET MN1. When the voltage of the capacitor 105 is discharged to the logic low voltage, the logic states of the reset terminal R, the set terminal S, the Q terminal and the Q' terminal of the R-S flip-flop 101 are respectively "1", "0", "0", "1". At this time, since the logic states of the set terminal S and the Q' terminal of the R-S flip-flop 101 are respectively "0", "1", and the logic states of the reset terminal R and the Q terminal of the R-S flip-flop 101 are respectively "1", "0", the output terminal of the NOR gate 103 and the output terminal of the NOR gate 104 are logic low voltage, the P-type MOSFETs MP1 and MP2 are turned on. Meanwhile, the capacitor 105 is rapidly charged to logic high voltage, and the logic states of the reset terminal R, the set terminal S, the Q terminal and the Q' terminal of the R-S flip-flop 101 becomes respectively "0", "0", "0", "1".

Next, since the logic states of the reset terminal R and the Q terminal of the R-S flip-flop 101 are "0", the output terminal of the NOR gate 104 outputs a logic high voltage, the P-type MOSFET MP2 is cut off. The capacitor 106 discharges through the N-type MOSFET MN2. When the capacitor 106 is discharged to logic low voltage, the logic states of the reset terminal R, the set terminal S, Q terminal and the Q' terminal of the R-S flip-flop 101 are respectively changed to "0", "1", "1", "0" again.

Figure 2:
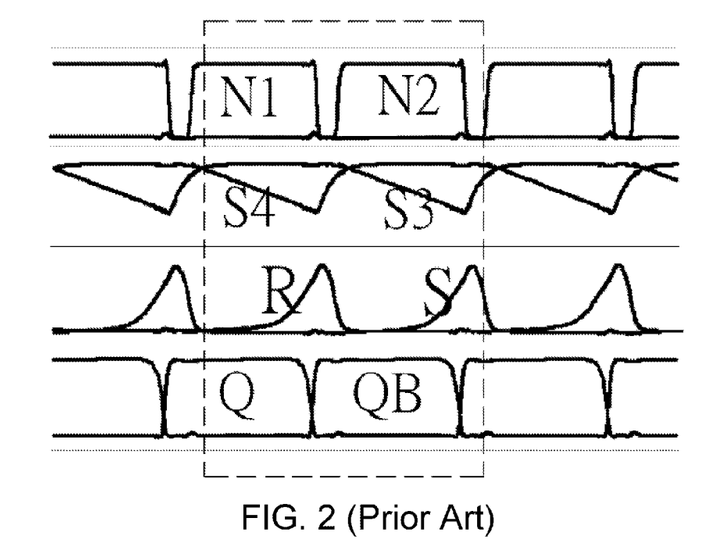
FIG. 2 illustrates the waveform depicting the operation of the relaxation oscillator in conventional art.

FIG. 2 illustrates the waveform depicting the operation of the relaxation oscillator in conventional art. Referring to FIG. 2, people having ordinary skill in the art can see that there is short period during which the voltage of the node N1 and the node N2 are logic low, even though the voltage waveform of the node N1 and the voltage waveform of the node N2 are in antiphase. Thus, the voltage of the node S3 does not be immediately discharge, when the voltage of the node N1 is logic low voltage, and also the voltage of the node S4 does not be immediately discharge, when the voltage of the node N2 is logic low voltage. It causes that the operational frequency of the relaxation oscillator may not be increased, that is to say, the relaxation oscillator consumes more current than other at the same operational frequency.

SUMMARY OF THE INVENTION

In view of the above-identified problems, it is therefore an object of the invention to provide a relaxation oscillator to increase the operational frequency and to reduce the delay of the internal circuit.

To achieve the above-identified object, the invention provides a relaxation oscillator. The relaxation oscillator includes an R-S flip-flop, a first delay circuit and a second delay circuit. The R-S flip-flop includes an S input terminal, a R input terminal, a Q terminal and a Q' terminal. The first delay circuit includes a first charging circuit, a first capacitor, a first discharging device and a first comparing/detecting circuit. The first terminal of the first charging circuit is coupled to a power voltage, the control terminal of the first charging circuit is coupled to the Q terminal. When the Q terminal outputs a first logic voltage, the first terminal of the first charging circuit is electrically conducted with the second terminal of the first charging circuit. The first terminal of the first capacitor is coupled to the second terminal of the first charging circuit, and the second terminal of the first capacitor is coupled to a common voltage. The first terminal of the first discharging device is coupled to the second terminal of the first charging circuit, the second terminal of the first discharging device is coupled to the common voltage. The input terminal of the first comparing/detecting circuit is coupled to the first terminal of the first capacitor, and the output terminal of the first comparing/detecting circuit is coupled to the R input terminal of the R-S flip-flop. When the voltage of the input terminal of the first comparing/detecting circuit is lower than the first voltage, the output terminal of the first comparing/detecting circuit outputs a first logic pulse.

The second delay circuit includes a second charging circuit, a second capacitor, a second discharging device and a second comparing/detecting circuit. The first terminal of the second charging circuit is coupled to the power voltage, the control terminal of the second charging circuit is coupled to the Q' terminal. When the Q' terminal outputs the first logic voltage, the first terminal of the second charging circuit is electrically conducted with the second terminal of the second charging circuit. The first terminal of the second capacitor is coupled to the second terminal of the second charging circuit, and the second terminal of the second capacitor is coupled to the common voltage. The first terminal of the second discharging device is coupled to the second terminal of the second charging circuit, the second terminal of the second discharging device is coupled to the common voltage. The input terminal of the second comparing/detecting circuit is coupled to the first terminal of the second capacitor, and the output terminal of the second comparing/detecting circuit is coupled to the S input terminal of the R-S flip-flop. When the voltage of the input terminal of the second comparing/detecting circuit is lower than the first voltage, the output terminal of the second comparing/detecting circuit outputs the first logic pulse.

According to the relaxation oscillator of a preferred embodiment of the present invention, the first charging circuit includes a first P-type MOSFET. The gate terminal of the first P-type MOSFET is coupled to the control terminal of the first charging circuit. The first source/drain terminal of the first P-type MOSFET is coupled to the first terminal of the first charging circuit, and the second source/drain terminal of the first P-type MOSFET is coupled to the second terminal of the first charging circuit. In addition, the first discharging device includes a first N-type MOSFET. The gate terminal of the first N-type MOSFET receives a first bias. The first source/drain terminal of the first N-type MOSFET is coupled to the first terminal of the first discharging device, and the second source/drain terminal of the first N-type MOSFET is coupled to the second terminal of the first discharging device.

According to the relaxation oscillator of a preferred embodiment of the present invention, the first comparing/detecting circuit includes a second P-type MOSFET and the second N-type MOSFET. The gate terminal of the second P-type MOSFET is coupled to a second bias, the first source/drain terminal of the second P-type MOSFET is coupled to the power voltage. The gate terminal of the second N-type MOSFET is coupled to the input terminal of the first comparing/detecting circuit, the first source/drain terminal of the second N-type MOSFET is coupled to the output terminal of the first comparing/detecting circuit and the second source/drain terminal of the second P-type MOSFET, and the second source/drain terminal of the second N-type MOSFET is coupled to the common voltage.

A relaxation oscillator is provided in the present invention. The relaxation oscillator includes an R-S flip-flop, a first delay circuit and a second delay circuit. The R-S flip-flop includes an S input terminal, a R input terminal, a Q terminal and a Q' terminal. The first delay circuit includes a first inverter, a first capacitor and a first comparing/detecting circuit. The input terminal of the first inverter is coupled to the Q terminal. The first terminal of the first capacitor is coupled to the output terminal of the first inverter, and the second terminal of the first capacitor is coupled to a common voltage. The input terminal of the first comparing/detecting circuit is coupled to the first terminal of the first capacitor, and the output terminal of the first comparing/detecting circuit is coupled to the R input terminal of the R-S flip-flop. The second delay circuit includes a second inverter, a second capacitor and a second comparing/detecting circuit. The input terminal of the second inverter is coupled to the Q' terminal. The first terminal of the second capacitor is coupled to the output terminal of the second inverter, and the second terminal of the first capacitor is coupled to the common voltage. The input terminal of the first comparing/detecting circuit is coupled to the first terminal of the second capacitor, and the output terminal of the first comparing/detecting circuit is coupled to the S input terminal of the R-S flip-flop.

According to the relaxation oscillator of a preferred embodiment of the present invention, the first inverter includes a first P-type MOSFET and a first N-type MOSFET. The gate terminal of the first P-type MOSFET is coupled to the Q terminal, and the first source/drain terminal of the first P-type MOSFET is coupled to a power voltage. The gate terminal of the first N-type MOSFET is coupled to the Q terminal, the first source/drain terminal of the first N-type MOSFET is coupled to the second source/drain terminal of the first P-type MOSFET, and the second source/drain terminal of the first N-type MOSFET is coupled to the common voltage. In addition, the first delay circuit further includes a first bias current source, coupled between the power voltage and the first source/drain terminal of the first P-type MOSFET, for providing a constant current.

Furthermore, in a preferred embodiment, the first comparing/detecting circuit includes a second bias current source and a second N-type MOSFET. The first terminal of the second bias current source is coupled to a power voltage for providing a constant current. The gate terminal of the second N-type MOSFET is coupled to the input terminal of the first comparing/detecting circuit. The first source/drain terminal of the first N-type MOSFET is coupled to the second terminal of the second bias current source, and the second source/drain terminal of the first N-type MOSFET is coupled to the common voltage.

The spirit of the present invention is to use the state diagram to analysis the conventional circuit to search the key delay point. Thus, the logic delay of the conventional art can be reduced. Therefore, the relaxation oscillator of the present invention can provide more fast clock and reduce the current consumption. In addition, the operational concept of the relaxation oscillator becomes more intuition, thus, the relaxation oscillator of the present invention is more easy to use for circuit designer.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 3:
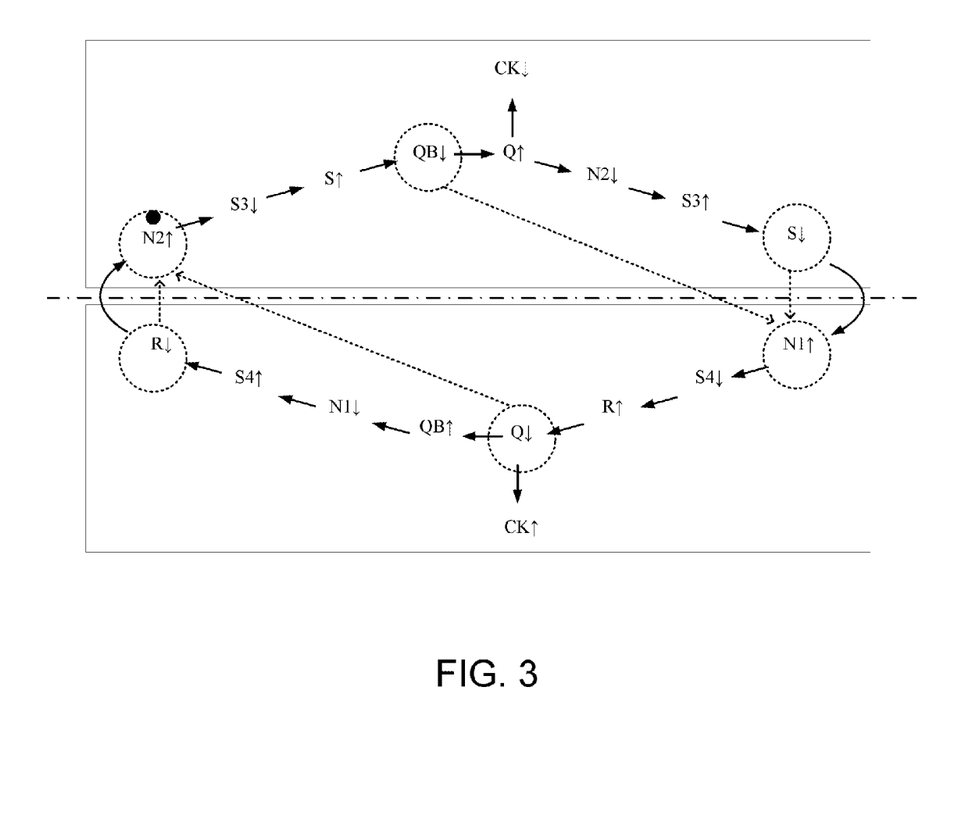
FIG. 3 illustrates a state diagram depicting a relaxation oscillator in conventional art according to a preferred embodiment of the present invention.

In order that people having ordinary skill in the art can know why the oscillating frequency cannot be increased, referring to FIG. 3, FIG. 3 illustrates a state diagram depicting a relaxation oscillator in conventional art according to a preferred embodiment of the present invention. As shown in FIG. 3, down arrow represents that voltage goes down, and up arrow represents that voltage goes up. When the voltage of the Q terminal goes down, the voltage of the Q' terminal QB goes up. Afterward, the voltage of the node N1 goes down, and then the voltage of the node S4 goes up, and the voltage of the R input terminal goes down, and next, the voltage of the node N2 goes up. In other words, from the time in which the voltage of the Q terminal goes down, to the time in which the voltage of the node N2 goes up, there are voltage delays of the QB terminal, the node N1, the node S4 and the R input terminal.

Similarly, When the voltage of the Q' terminal QB goes down, the voltage of the Q terminal goes up. Afterward, the voltage of the node N2 goes down, and then the voltage of the node S3 goes up, and the voltage of the S input terminal goes down, and next, the voltage of the node N1 goes up. In other words, there are voltage delays of the Q terminal, the node N2, the node S3 and the S input terminal. In the state diagram, it can be seen that the reason why the oscillating frequency of the relaxation oscillator cannot be increased is the first voltage delay from the time in which the voltage of the Q terminal goes down, to the time in which the voltage of the node N2 goes up, and the second voltage delay from the time in which the voltage of the Q' terminal QB goes down, to the time in which the voltage of the node N1 goes up.

Figure 4:
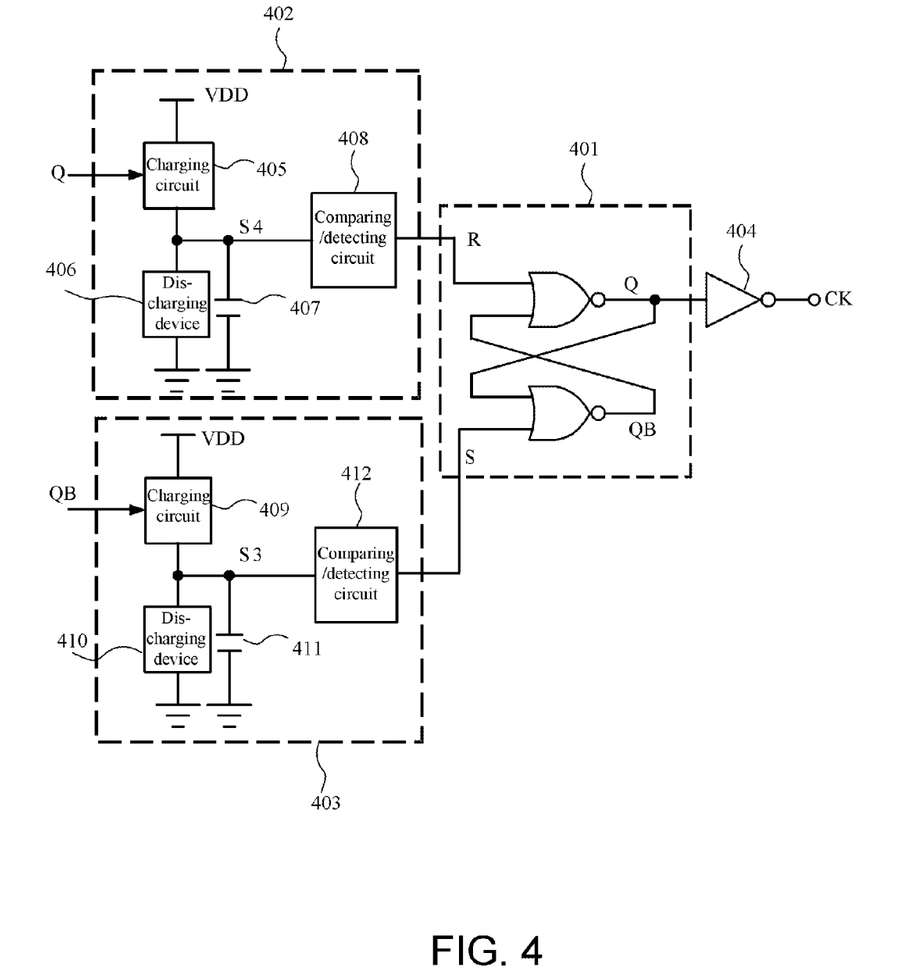
FIG. 4 illustrates a circuit diagram depicting a relaxation oscillator according to a preferred embodiment of the present invention.

Thus, designing the relaxation oscillator of the present invention should consider that the voltage of the node N1 should immediately goes up when the voltage of the Q' terminal QB goes down, and the voltage of the node N2 should immediately goes up when the voltage of the Q terminal goes down. FIG. 4 illustrates a circuit diagram depicting a relaxation oscillator according to a preferred embodiment of the present invention. Referring to FIG. 4, the relaxation oscillator includes an R-S flip-flop 401, a first delay circuit 402 and a second delay circuit 403. In this embodiment, the R-S flip-flop 401 is implemented by two NOR gates. In addition, a inverter is coupled to the Q terminal of the R-S flip-flop 401 to serve as a buffer circuit. The buffer circuit is used to increase the driving power for driving a load or to shape the outputted waveform.

The first delay circuit 402 includes a charging circuit 405, a discharging device 406, a capacitor 407 and a comparing/detecting circuit 408. The second delay circuit 403 also includes a charging circuit 409, a discharging device 410, a capacitor 411 and a comparing/detecting circuit 412. In order to describe the operational concept of the relaxation oscillator, it is assumed that the initial logic states of the R input terminal, the S input terminal, the Q terminal and the Q' terminal of the R-S flip-flop 401 are respectively "0", "1", "1" and "0". At this time, the voltage of the node S4 is logic high voltage, the voltage of the node S3 is lower than the detecting voltage of the comparing/detecting circuit 412. Since the logic state of the Q' terminal is "0" and the logic state of the Q terminal is "1", the charging circuit 409 is turned on, the charging circuit 405 is cut off. The capacitor 411 is rapidly charged to the logic high voltage, meanwhile, the capacitor 407 is discharged by the discharging device 406. When the voltage of the capacitor 407 is discharged to the detecting voltage of the comparing/detecting circuit 408, the voltage of the S input terminal of the R-S flip-flop 401 becomes logic low voltage, and the voltage of the R input terminal of the R-S flip-flop 401 becomes logic high voltage. At this time, the logic states of the R input terminal, the S input terminal, the Q terminal and the Q' terminal of the R-S flip-flop 401 are respectively changed to "1", "0", "0" and "1".

Afterward, since the logic state of the Q terminal of the R-S flip-flop 401 is "0", and the logic state of the Q' terminal of the R-S flip-flop 401 is "1", the charging circuit 405 is turned on, and the charging circuit 409 is cut off. At this time, the capacitor 407 is rapidly charged to logic high voltage and the capacitor 411 is discharged by the discharging device 410. When the voltage of the capacitor 411 is discharged to the detecting voltage of the comparing/detecting circuit 412, the R input terminal of the R-S flip-flop 401 becomes logic low voltage. At this time, the logic states of the R input terminal, the S input terminal, the Q terminal and the Q' terminal of the R-S flip-flop 401 are respectively changed to "0", "1", "1" and "0".

Please comparing the present embodiment with the conventional art, people having ordinary skill in the art should know that the capacitor 105 would be discharged by the delay circuit until the logic states of the S input terminal and the Q' terminal of the R-S flip-flop 101 are all "0" and the capacitor 106 would be discharged by the delay circuit until the logic state of the R input terminal and the logic state of the Q terminal are all "0". In this embodiment, the capacitor 407 is immediately discharged when the Q terminal of the R-S flip-flop 401 becomes "1", and the capacitor 411 is immediately discharged when the Q' terminal of the R-S flip-flop 401 becomes "1". In other words, the circuit providing by the embodiment of the present invention can greatly reduce the delay time.

Figure 5A:
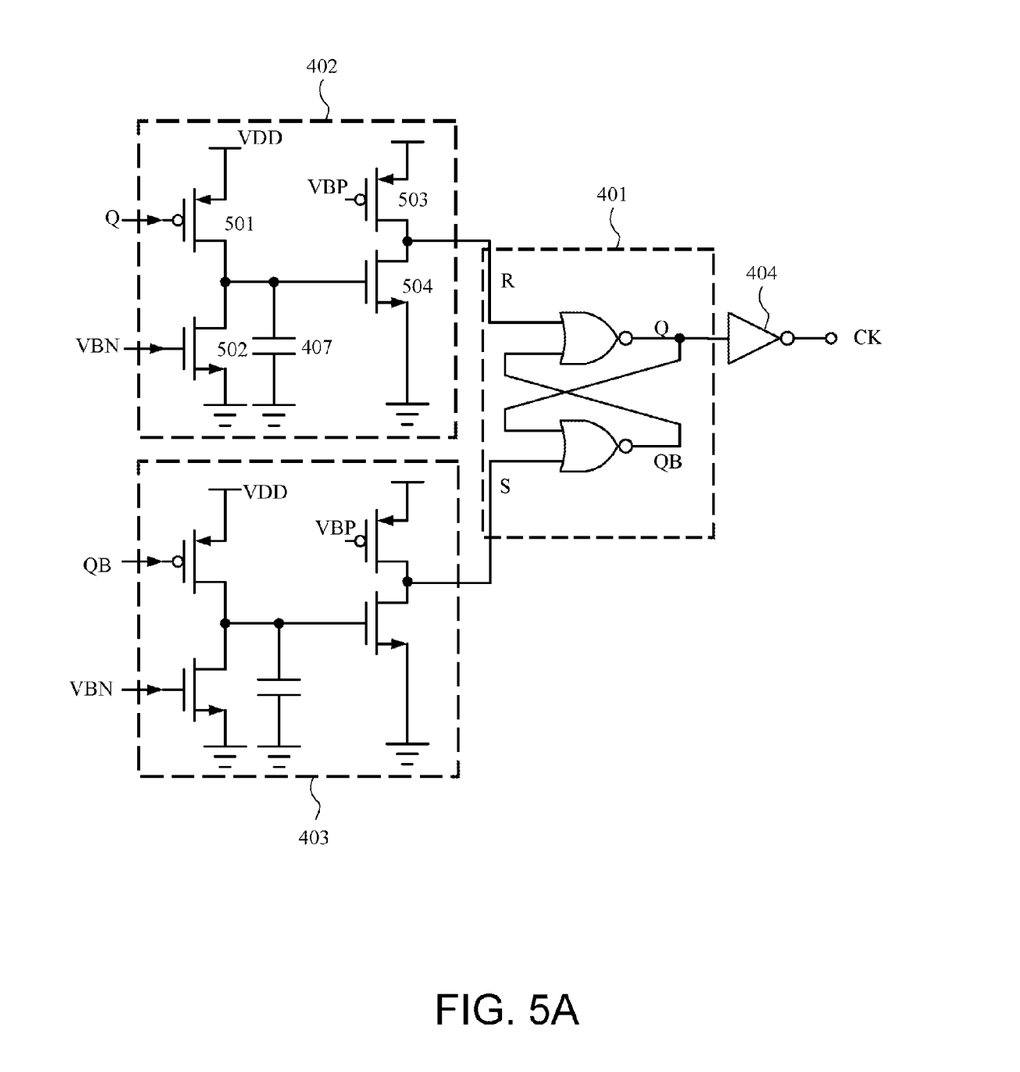
FIG. 5A illustrates a circuit diagram depicting a relaxation oscillator according to a preferred embodiment of the present invention.

FIG. 5A illustrates a circuit diagram depicting a relaxation oscillator according to a preferred embodiment of the present invention. Referring to FIG. 5A, in this embodiment, the charging circuit 405 of the first delay circuit 402 is implemented by a P-type MOSFET 501. When the logic state of the Q terminal of the R-S flip-flop 401 is "0", the P-type MOSFET 501 is turned on to charge the capacitor 407. The discharging device 406 is implemented by an N-type MOSFET 502 with gate bias VBN. The comparing/detecting circuit 408 is implemented by an N-type MOSFET 504 and a P-type MOSFET 503 with gate bias VBP. Moreover, since the implementation of the second delay circuit 403 is the same as that of the first delay circuit 402, the detail description is omitted.

Figure 5B:
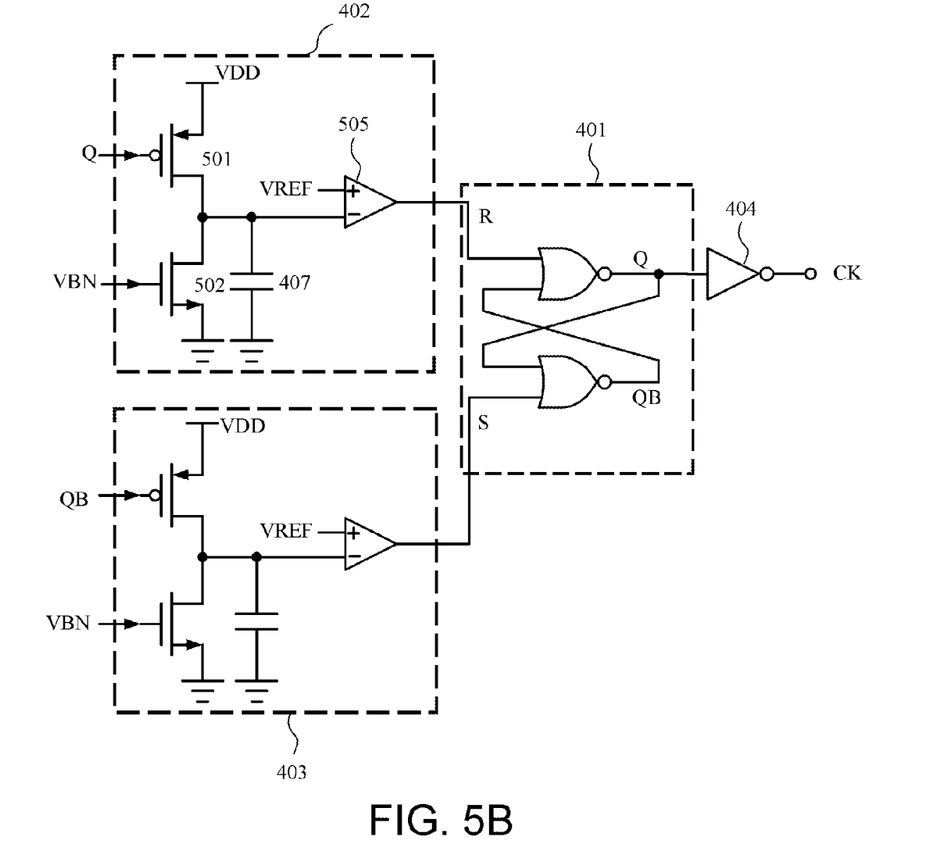
FIG. 5B illustrates a circuit diagram depicting a relaxation oscillator according to a preferred embodiment of the present invention.

FIG. 5B illustrates a circuit diagram depicting a relaxation oscillator according to a preferred embodiment of the present invention. Referring to FIG. 5B, in this embodiment, the comparing/detecting circuit 408 is implemented by a comparator 505. The positive input terminal of the comparator 505 receives a reference voltage VREF, the negative input terminal of the comparator 505 is coupled to the capacitor 407. When the voltage of the Q terminal becomes logic high voltage, and the voltage of the capacitor 407 is discharged to a voltage lower than the reference voltage VREF by the N-type MOSFET 502, the comparator 505 outputs a first logic pulse. In addition, the implementation of the second delay circuit 403 is the same as that of the first delay circuit 402, the detail description is omitted. Furthermore, the reference voltage VREF can be implemented by the voltage bias VBN or generated by a bandgap reference voltage generator.

Figure 6:
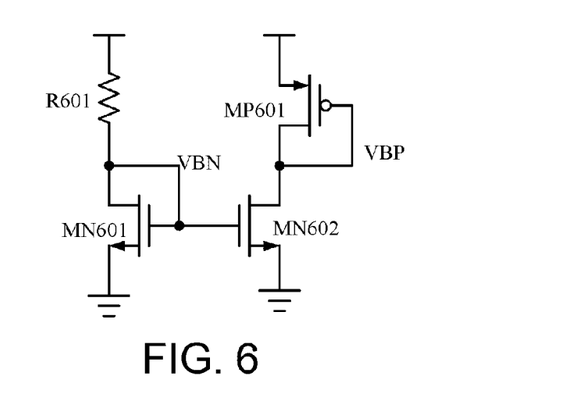
FIG. 6 illustrates a circuit diagram depicting a bias generating circuit of the relaxation oscillator according to a preferred embodiment of the present invention.

FIG. 6 illustrates a circuit diagram depicting a bias generating circuit of the relaxation oscillator according to a preferred embodiment of the present invention. Referring to FIG. 6, the bias generating circuit is used for generating the biases VBN and VBP. The bias generating circuit includes a resistor R601, N-type MOSFETs MN601, MN602 and a P-type MOSFET MP601. As shown in FIG. 6, the current flowing through the N-type MOSFET 502 is directly proportional to the current flowing through the N-type MOSFET MN601, and the current flowing through the P-type MOSFET 503 is directly proportional to the current flowing through the P-type MOSFET MP601. Here, in order to conveniently describe the importance of the bias generator to people having ordinary skill in the art, the mathematical derivation is adopted.

First, it is assumed that the current flowing through the resistor R601 is represented as IR. The current IR can be represented as:

$$I_R = \frac{VDD - VBN}{R} \quad (1)$$

Also, it is assumed that the capacitance of the capacitor 407 is C, the voltage variation is ΔV, and the current flowing through the N-type MOSFET 502 is IM, the capacitor formula can be represented as:

$$C\Delta V = I_M T$$

In addition, the voltage variation of the capacitor 407 is ΔV=VDD−VBN, and the current IM is proportional to the current IR (assuming the proportional coefficient is m). Thus the equation (2) can be modified as:

$$C(VDD - VBN) = m\frac{VDD - VBN}{R}T \quad (3)$$

To reform the equation (3), we obtain $$T = \frac{RC}{m} \quad (4)$$

According to the mathematical derivation, people having ordinary skill in the art should know that the relaxation oscillator of the embodiment of the present invention can generate a clock irrelevant to the power voltage VDD, process parameter and temperature, because of the implementation of the bias generating circuit.

Figure 7:
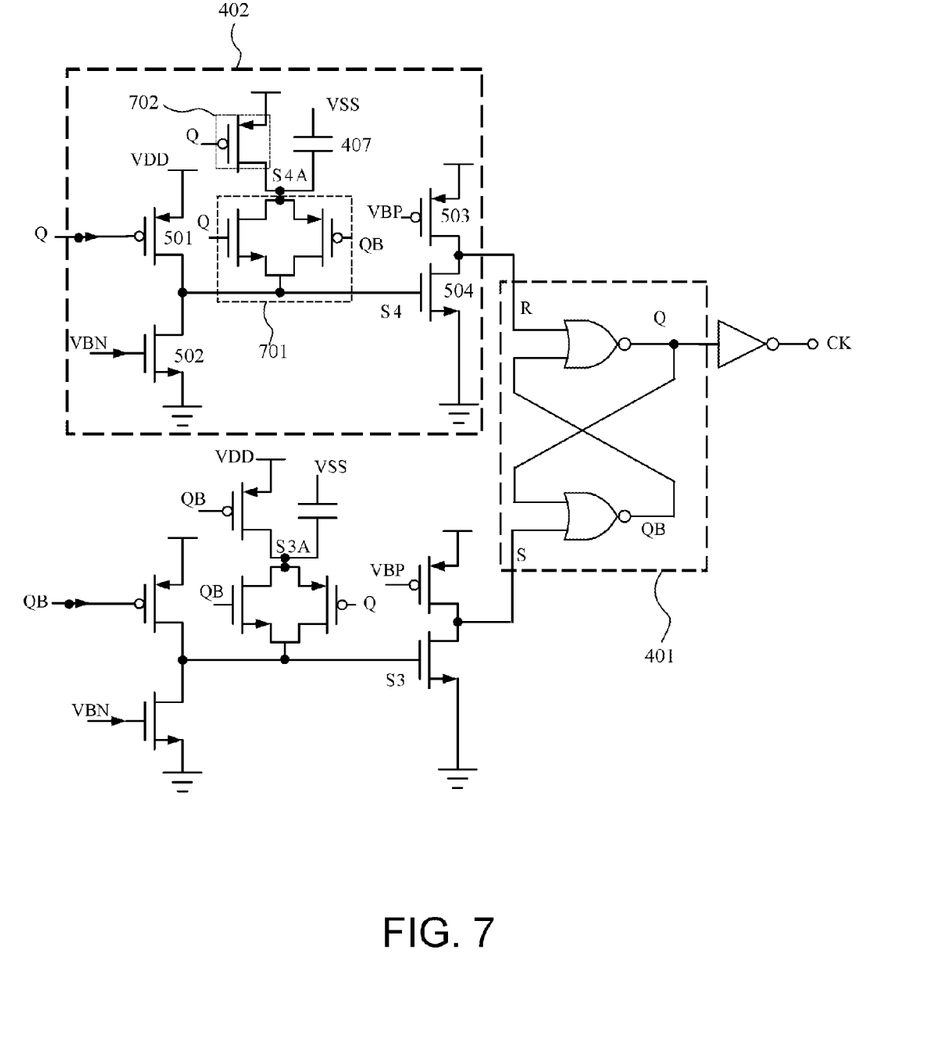
FIG. 7 illustrates a circuit diagram depicting a relaxation oscillator according to a preferred embodiment of the present invention.

FIG. 7 illustrates a circuit diagram depicting a relaxation oscillator according to a preferred embodiment of the present invention. Referring to FIG. 7, besides the P-type MOSFET 501, the N-type MOSFET 502, the P-type MOSFET 503, the N-type MOSFET 504 in FIG. 5 and the capacitor 407 in FIG. 4, the first delay circuit 402 in this embodiment also includes a switch circuit 701 and a charging circuit 702, wherein the switch circuit 701 is implemented by a transmission gate, and the charging circuit is implemented by a P-type MOSFET.

In particular, when the logic state of Q terminal of the R-S flip-flop 401 is "0", the switch circuit 701 is cut off, the node S4 would be rapidly charged to the logic "1". Thus, the logic state of the R input terminal of the R-S flip-flop 401 would rapidly change from logic "1" to "0". Also, the charging circuit 702 independently charges the capacitor 701. When the Q terminal of the R-S flip-flop 401 outputs logic "1", the switch circuit 701 is turned on, and the charging circuit 702 is cut off. The node S4 is discharged through switch circuit 701 and the N-type MOSFET 501. Therefore, the implementation of the present embodiment can further increase the operational frequency. Moreover, the implementation of the second delay circuit 403 is the same as that of the first delay circuit 402. Thus, the detail description is omitted.

Figure 8A:
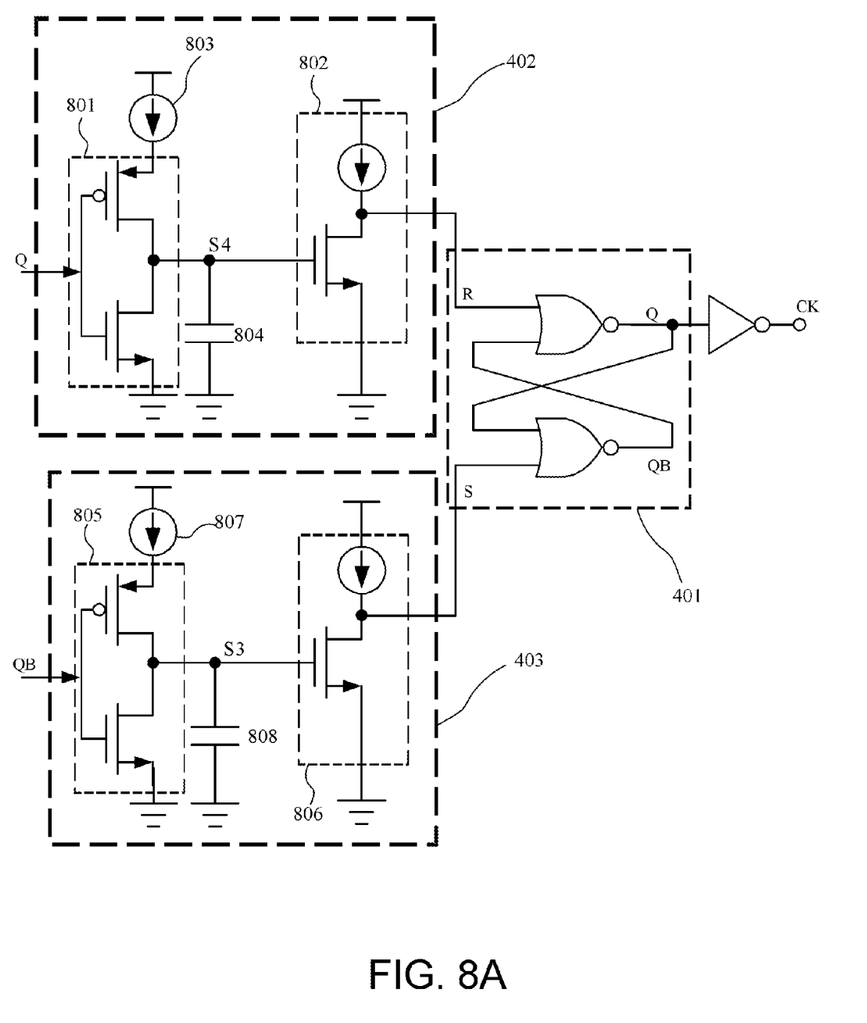
FIG. 8A illustrates a circuit diagram depicting a relaxation oscillator according to a preferred embodiment of the present invention.

FIG. 8A illustrates a circuit diagram depicting a relaxation oscillator according to a preferred embodiment of the present invention. Referring to FIG. 8, in this embodiment, the first delay circuit 402 is implemented by an inverter 801, a comparing/detecting circuit 802, a bias current source 803 and a capacitor 804. The second delay circuit 403 is implemented by an inverter 805, a comparing/detecting circuit 806, a bias current source 807 and a capacitor 808. The comparing/detecting circuit 802 in this embodiment is implemented by an N-type MOSFET and a current source, and the comparing/detecting circuit 806 in this embodiment is also implemented by an N-type MOSFET and a current source.

First, it is assumed that the logic states of the R input terminal, the S input terminal, the Q terminal and the Q' terminal of the R-S flip-flop 401 are respectively "0", "1", "1" and "0". At this time, the voltage of the node S4 is logic high voltage, the voltage of the node S3 is lower than the detecting voltage of the comparing/detecting circuit 806 (In this embodiment, the detecting voltage is the threshold voltage of the N-type MOSFET). Since the logic state of the Q' terminal is "0", and the logic state of the Q terminal is "1", the inverter 805 outputs "1", and the inverter 801 outputs "0", the capacitor 808 is charged to logic high voltage by the constant current of the bias current source 807. Meanwhile, the capacitor 804 is discharged by the N-type MOSFET of the inverter 801. Thus, the S input terminal of the R-S flip-flop 401 becomes logic low voltage, and the R input terminal of the R-S flip-flop 401 becomes logic high voltage. At this time, the logic states of the R input terminal, the S input terminal, the Q terminal and the Q' terminal of the R-S flip-flop 401 are respectively "1", "0", "0" and "1".

Next, since the logic state of the Q terminal of the R-S flip-flop 401 is "0", and logic state of the Q' terminal of the R-S flip-flop 401 is "1", the inverter 801 outputs "1", meanwhile, the inverter 805 outputs "0". At this time, the capacitor 804 is charged to logic high voltage by the constant current of the bias current source 803, and the capacitor 808 is discharged by the N-type MOSFET of the inverter 805. the logic states of the R input terminal, the S input terminal, the Q terminal and the Q' terminal of the R-S flip-flop 401 are respectively changed to "0", "1", "1" and "0".

Similarly, comparing the abovementioned embodiment with the conventional art, people having ordinary skill in the art should know that the capacitor 105 would be discharged by the delay circuit until the logic states of the S input terminal and the Q' terminal of the R-S flip-flop 101 are all "0" and the capacitor 106 would be discharged by the delay circuit until the logic state of the R input terminal and the logic state of the Q terminal are all "0". In this embodiment, the capacitor 808 is immediately discharged when the Q terminal of the R-S flip-flop 401 becomes "1", and the capacitor 804 is immediately discharged when the Q' terminal of the R-S flip-flop 401 becomes "1". In other words, the circuit providing by the embodiment of the present invention can greatly reduce the delay time.

Figure 8B:
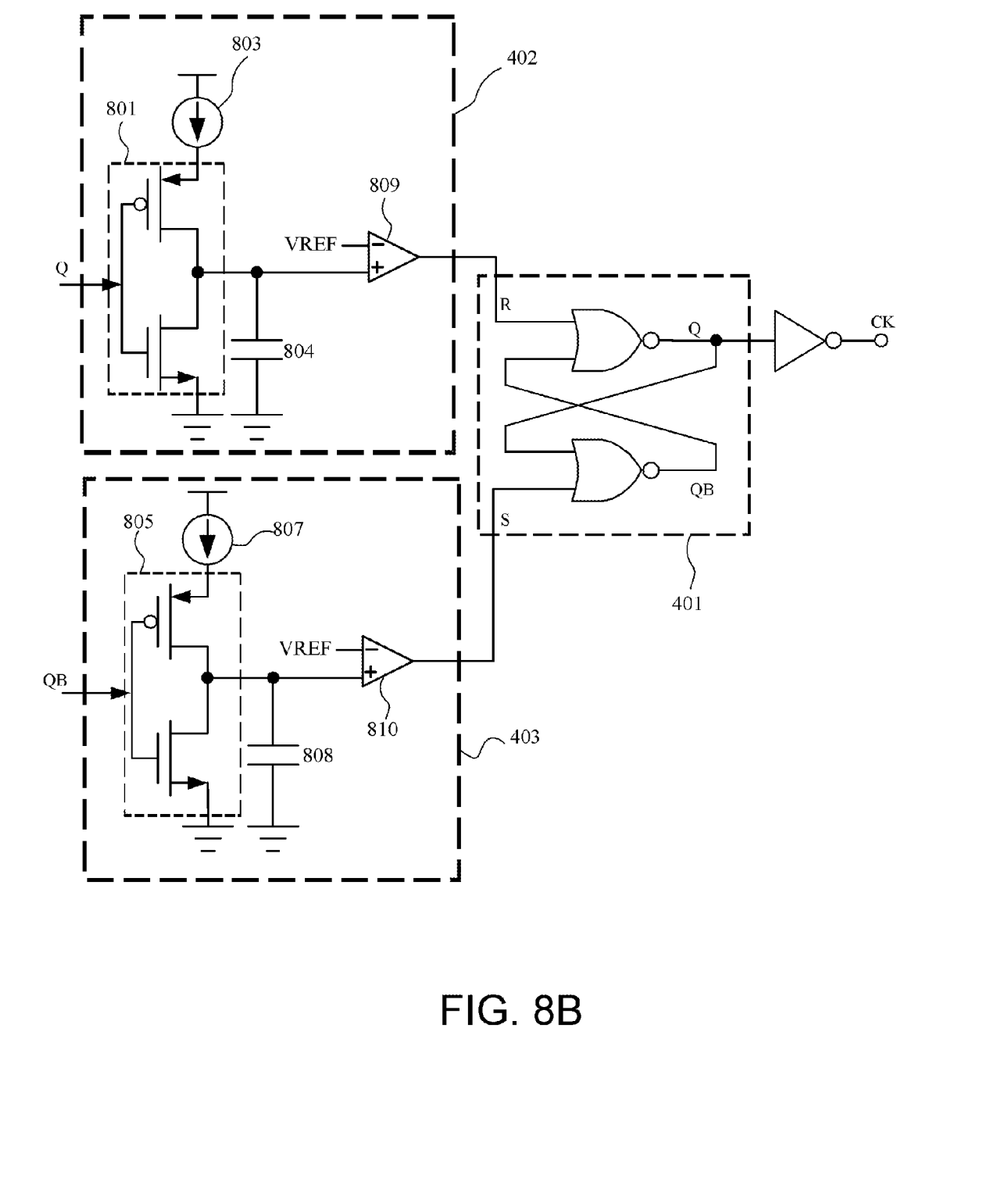
FIG. 8B illustrates a circuit diagram depicting a relaxation oscillator according to a preferred embodiment of the present invention.

FIG. 8B illustrates a circuit diagram depicting a relaxation oscillator according to a preferred embodiment of the present invention. Referring to FIG. 8B, in this embodiment, the comparing/detecting circuit 802 is implemented by a comparator 809. The negative input terminal of the comparator 809 receives a reference voltage VREF, and the positive input terminal of the comparator 809 is coupled to the capacitor 804. In addition, the comparing/detecting circuit 806 is implemented by a comparator 810. The negative input terminal of the comparator 810 receives a reference oltage VREF, and the positive input terminal of the comparator 810 is coupled to the capacitor 808. The operation concept thereof is similar to that of the abovementioned embodiment. The difference is the detecting voltage is determined by the reference voltage VREF instead of the threshold voltage of MOSFET.

Figure 9:
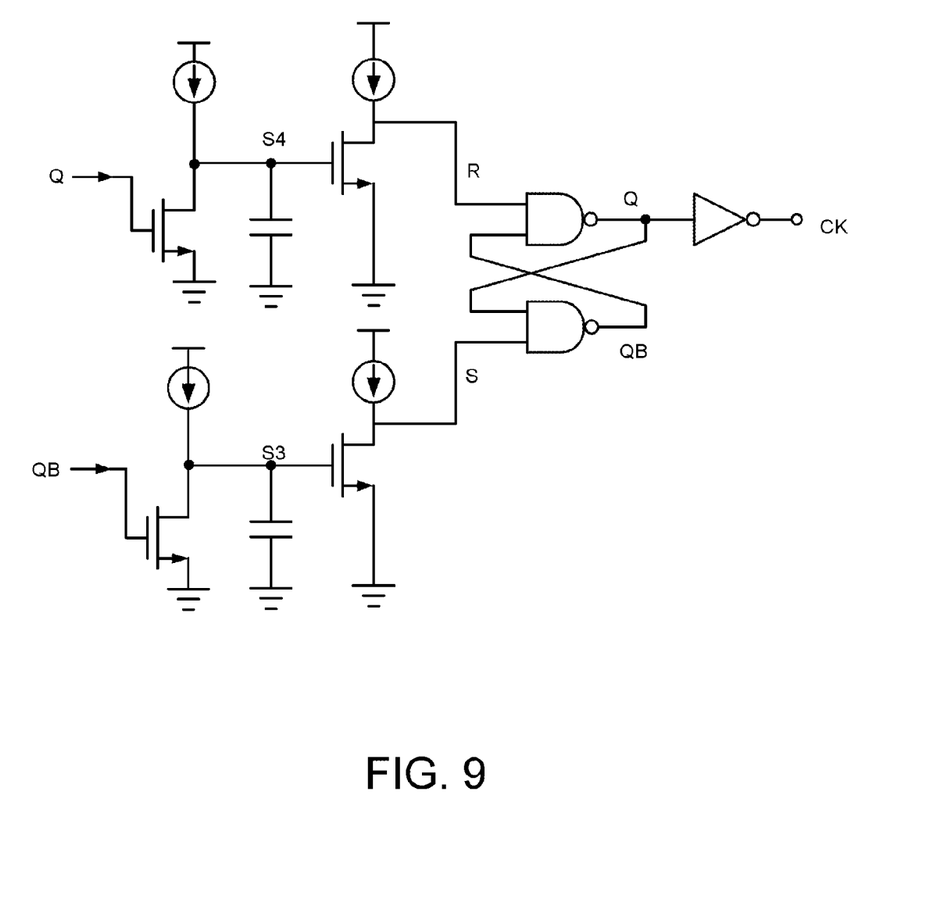
FIG. 9 illustrates a circuit diagram depicting a relaxation oscillator according to a preferred embodiment of the present invention.

FIG. 9 illustrates a circuit diagram depicting a relaxation oscillator according to a preferred embodiment of the present invention. Referring to FIG. 8A, FIG. 8B and FIG. 9, in this embodiment, the P-type MOSFETs of the inverters 801 and 805 of delay circuit is removed. In FIG. 8A and FIG. 8B, the P-type MOSFETs are used for electrically disconnecting the current sources 803 and 807 the N-type MOSFETs when the N-type MOSFET discharges the capacitor. Thus, the current from the current sources 803 and 807 does not pass through the N-type MOSFETs and the extra current consumption would be prevented. In this embodiment, the P-type MOSFETs is removed, but the number of the cascade devices is reduced. Thus, the relaxation oscillator can operate in lower supply voltage. The operation of the relaxation oscillator is the same as those of relaxation oscillator in FIG. 8A and FIG. 8B. Thus, the detail description is omitted.

Figure 10:
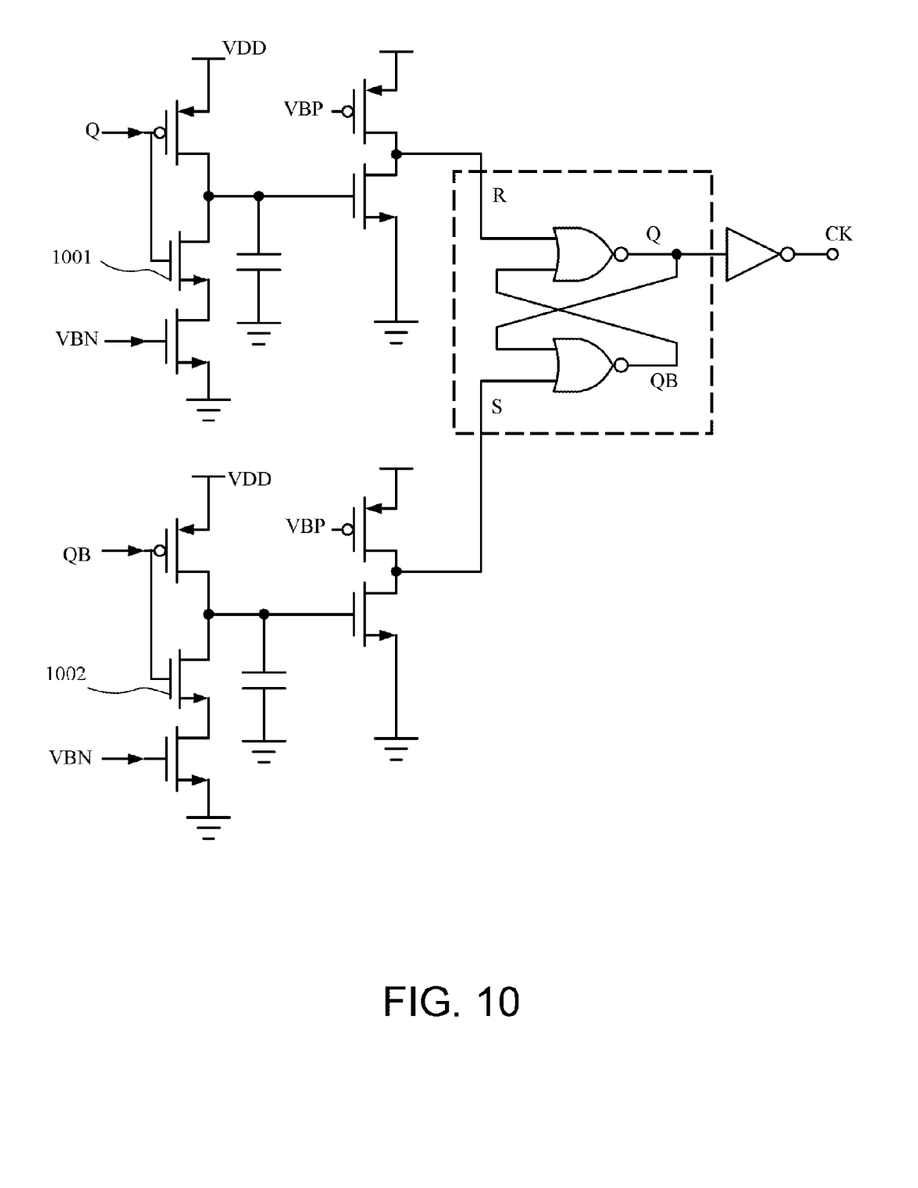
FIG. 10 illustrates a circuit diagram depicting a relaxation oscillator according to a preferred embodiment of the present invention.

FIG. 10 illustrates a circuit diagram depicting a relaxation oscillator according to a preferred embodiment of the present invention. Referring to FIG. 10, FIG. 5A and FIG. 5B, in this embodiment, N-type MOSFETs 1001 and 1002 are respectively added into the delay circuits 402 and 403. The N-type MOSFET 1001 can cut the discharging route (502) when the charging circuit 501 charges the capacitor 407. Therefore, the fast charge can be achieved, and the operational frequency of the relaxation oscillator can be further increased.

In summary, the spirit of the present invention is to use the state diagram to analysis the conventional circuit to search the key delay point. Thus, the logic delay of the conventional art can be reduced. Therefore, the relaxation oscillator of the present invention can provide more fast clock and reduce the current consumption. In addition, the operational concept of the relaxation oscillator becomes more intuition, thus, the relaxation oscillator of the present invention is more easy to use for a circuit designer.

In addition, the relaxation oscillator can generate a clock irrelevant to the power voltage VDD, process parameter and temperature if the delay circuit coordinating with the bias generating circuit in the preferred embodiment of the present invention.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A relaxation oscillator, comprising:
   a S-R flip flop, comprising a S input terminal, a R input terminal, a Q terminal and a Q' terminal;
   a first delay circuit, comprising:
      a first charging circuit, comprising a first terminal, a second terminal and a control terminal, wherein the first terminal of the first charging circuit is coupled to a power voltage, the control terminal of the first charging circuit is coupled to the Q terminal, wherein the first terminal of the first charging circuit is electrically conducted with the second terminal of the first charging circuit when the Q terminal outputs a first logic voltage;
      a first capacitor, comprising a first terminal and a second terminal, wherein the first terminal of the first capacitor is coupled to the second terminal of the first charging circuit, and the second terminal of the first capacitor is coupled to a common voltage;
      a first discharging device, comprising a first terminal and a second terminal, wherein the first terminal of the first discharging device is coupled to the second terminal of the first charging circuit, and the second terminal of the first discharging device is coupled to the common voltage; and
      a first comparing/detecting circuit, comprising an input terminal and an output terminal, wherein the input terminal of the first comparing/detecting circuit is coupled to the first terminal of the first capacitor, and the output terminal of the first comparing/detecting circuit is coupled to the R input terminal of the S-R flip flop,
      wherein the output terminal of the first comparing/detecting circuit outputs a first logic pulse when a voltage of the input terminal of the first comparing/detecting circuit is lower than a first voltage; and
   a second delay circuit, comprising:
      a second charging circuit, comprising a first terminal, a second terminal and a control terminal, wherein the first terminal of the second charging circuit is coupled to a power voltage, the control terminal of the first charging circuit is coupled to the Q' terminal, wherein the first terminal of the second charging circuit is electrically conducted with the second terminal of the second charging circuit when the Q' terminal outputs the first logic voltage;
      a second capacitor, comprising a first terminal and a second terminal, wherein the first terminal of the second capacitor is coupled to the second terminal of the second charging circuit, and the second terminal of the second capacitor is coupled to the common voltage;

a second discharging device, comprising a first terminal and a second terminal, wherein the first terminal of the second discharging device is coupled to the second terminal of the second charging circuit, and the second terminal of the second discharging device is coupled to the common voltage; and a second comparing/detecting circuit, comprising an input terminal and an output terminal, wherein the input terminal of the second comparing/detecting circuit is coupled to the first terminal of the second capacitor, and the output terminal of the second comparing/detecting circuit is coupled to the S input terminal of the S-R flip flop, wherein the output terminal of the second comparing/detecting circuit outputs the first logic pulse when a voltage of the input terminal of the second comparing/detecting circuit is lower than a second voltage, wherein the first discharging device comprises:

a first N-type MOSFET, includes a gate terminal, a first source/drain terminal and a second source/drain terminal, wherein the gate terminal of the first N-type MOSFET receives a first bias, the first source/drain terminal of the first N-type MOSFET is coupled to the first terminal of the first discharging device, and the second source/drain terminal of the first N-type MOSFET is coupled to the second terminal of the first discharging device, wherein the first bias is generated by a bias generator, wherein the bias generator comprises:

a first resistor, includes a first terminal and a second terminal, wherein the first terminal of the first resistor is coupled to the power voltage;

a second N-type MOSFET, includes a gate terminal, a first source/drain terminal and a second source/drain terminal, wherein the gate terminal of the second N-type MOSFET is coupled to the first source/drain terminal of the second N-type MOSFET, and the second terminal of the second N-type MOSFET is coupled to the common voltage;

a third N-type MOSFET, includes a gate terminal, a first source/drain terminal and a second source/drain terminal, wherein the gate terminal of the third N-type MOSFET is coupled to the gate terminal of the second N-type MOSFET, and the second terminal of the third N-type MOSFET is coupled to the common voltage; and a second P-type MOSFET, includes a gate terminal, a first source/drain terminal and a second source/drain terminal, wherein the gate terminal of the second P-type MOSFET is coupled to the second source/drain terminal of the second P-type MOSFET and the first source/drain terminal of the third N-type MOSFET, and the first source/drain terminal of the second P-type MOSFET is coupled to the power voltage, wherein a voltage of the gate terminal of the second N-type MOSFET is the first bias, and wherein the bias generator provides the clock signal being produced substantially independent of the power voltage, process parameter and temperature.

2. The relaxation oscillator according to claim 1, wherein the first charging circuit comprises:

a first P-type MOSFET, includes a gate terminal, a first source/drain terminal and a second source/drain terminal, wherein the gate terminal of the first P-type MOSFET is coupled to the control terminal of the first charging circuit, the first source/drain terminal of the first P-type MOSFET is coupled to the first terminal of the first charging circuit, and the second source/drain terminal of the first P-type MOSFET is coupled to the second terminal of the first charging circuit.

3. The relaxation oscillator according to claim 1, wherein the first comparing/detecting circuit comprises:

a third P-type MOSFET, includes a gate terminal, a first source/drain terminal and a second source/drain terminal, wherein the gate terminal of the third P-type MOSFET is coupled to a second bias, the first source/drain terminal of the third P-type MOSFET is coupled to the power voltage; and a fourth N-type MOSFET, includes a gate terminal, a first source/drain terminal and a second source/drain terminal, wherein the gate terminal of the fourth N-type MOSFET is coupled to the input terminal of the first comparing/detecting circuit, the first source/drain terminal of the fourth N-type MOSFET is coupled to the output terminal of the first comparing/detecting circuit and the second source/drain terminal of the third P-type MOSFET, and the second source/drain terminal of the fourth N-type MOSFET is coupled to the common voltage.

4. The relaxation oscillator according to claim 1, between the first terminal of the first capacitor and the second terminal of the first charging circuit, further comprising:

a first switch, comprising a first terminal, a second terminal and a control terminal, wherein the control terminal of the first switch is coupled to the Q terminal, the first terminal of the first switch is coupled to the first terminal of the first discharging device and the second terminal of the first charging circuit, and the second terminal of the first switch is coupled to the first terminal of the first capacitor; and a third charging circuit, comprising a first terminal, a second terminal and a control terminal, wherein the first terminal of the third charging circuit is coupled to the power voltage, the control terminal of the third charging circuit is coupled to the Q terminal, and the second terminal of the third charging circuit is coupled to the first terminal of the first capacitor, wherein the first terminal of the third charging circuit is electrically conducted with the second terminal of the third charging circuit, and the first terminal of the first switch is disconnected with the second terminal of the first switch when the Q terminal outputs the first logic voltage, wherein the first terminal of the third charging circuit is disconnected with the second terminal of the third charging circuit, and the first terminal of the first switch is electrically conducted with the second terminal of the first switch when the Q terminal outputs a second logic voltage.

* * * * *